United States Patent [19]

Crabb et al.

[11] Patent Number: 5,435,682
[45] Date of Patent: Jul. 25, 1995

[54] CHEMICAL VAPOR DESPOSITION SYSTEM

[75] Inventors: Richard Crabb, Mesa; McDonald Robinson, Paradise Valley; Mark R. Hawkins, Mesa; Dennis L. Goodwin, Tempe; Armand P. Ferro, Scottsdale, all of Ariz.; Wiebe B. deBoer, Eersel, Netherlands; Albert E. Ozias, Aumsville, Oreg.

[73] Assignee: Advanced Semiconductor Materials America, Inc., Phoenix, Ariz.

[21] Appl. No.: 255,114

[22] Filed: Jun. 7, 1994

Related U.S. Application Data

[60] Continuation of Ser. No. 885,124, May 18, 1992, abandoned, which is a continuation of Ser. No. 720,750, Jun. 25, 1991, Pat. No. 5,156,521, which is a continuation of Ser. No. 468,572, Jan. 23, 1990, abandoned, which is a division of Ser. No. 315,332, Feb. 24, 1989, Pat. No. 5,092,728, which is a division of Ser. No. 108,771, Oct. 15, 1987, Pat. No. 4,828,224.

[51] Int. Cl.$^6$ ............................................. A61K 27/02
[52] U.S. Cl. ..................... 414/217; 414/225; 414/935; 414/939; 414/937; 414/416; 118/719; 118/641; 118/620; 432/239; 204/288.25
[58] Field of Search ............... 414/217, 222, 416, 417, 414/939, 940, 941, 331, 225, 935, 937, 786, 744.2; 118/719, 730, 620, 641; 204/298.25; 251/298, 303, 326; 901/40; 432/239, 242, 244

[56] References Cited

U.S. PATENT DOCUMENTS

| | | |
|---|---|---|
| 3,335,998 | 8/1967 | Heinz . |
| 3,857,545 | 12/1974 | Santi . |
| 4,141,458 | 2/1979 | Brooks et al. . |
| 4,281,511 | 11/1980 | Harada et al. ............... 414/225 X |
| 4,293,249 | 10/1981 | Whelan ........................ 414/217 X |

(List continued on next page.)

FOREIGN PATENT DOCUMENTS

| | | |
|---|---|---|
| 2162367 | 1/1986 | United Kingdom . |
| 8704414 | 7/1987 | WIPO . |
| 8707309 | 12/1987 | WIPO . |

OTHER PUBLICATIONS

"A Novel Separated Chamber Deposition System for the Production of Amorphous Silicon Photovoltaic Cells", Gallego, et al., Sixth E. C. Photovoltaic Conference, Apr. 15-19, 1985, pp. 732-734.

Vacu-tran TM Vacuum Transport Station by Brooks Automation, a Division of Aeronca Electronics, Inc., Billerica, Mass., Mar., 1986.

Product Information Brochure entitled "Heavy Duty Orbitran TM Robot" and the brochure is made by Brooks Automation, a Division of Aeronca Electronis, Inc., Billerica, Mass., Mar., 1986.

(List continued on next page.)

Primary Examiner—Frank E. Werner
Attorney, Agent, or Firm—Knobbe, Martens, Olson & Bear

[57] ABSTRACT

This invention discloses a system for chemically depositing various materials carried by a reactant gas onto substrates for manufacturing semiconductor devices. The system includes special loading and unloading subsystems for placement of substrates to be processed into the system and subsequent extraction without contamination of the system. A special substrate handling subsystem is provided for moving the substrates to and from at least one processing sub-system without physically contacting the planar surfaces of the substrates. The processing sub-system includes a horizontal gas flow reaction chamber having a rotatable susceptor therein for rotating the single substrate supportable thereon about an axis that is normal to the center of the substrate for averaging of the temperature and reactant gas concentration variables. The processing sub-system is separated from the handling sub-system by a special isolation valve and a gas injection device is used to inject the gas into the reaction chamber with a predetermined velocity profile. A special temperature sensing arrangement is provided in the processing sub-system for controlling a radiant heating sub-system which is provided above and below the reaction chamber.

10 Claims, 7 Drawing Sheets

U.S. PATENT DOCUMENTS

| | | |
|---|---|---|
| 4,405,435 | 9/1983 | Tateishi et al. ............... 414/217 X |
| 4,501,527 | 2/1985 | Jacoby et al. . |
| 4,503,807 | 3/1985 | Nakayama et al. . |
| 4,505,452 | 3/1985 | Bragin et al. . |
| 4,553,069 | 11/1985 | Purser ............... 414/225 X |
| 4,584,045 | 4/1986 | Richards . |
| 4,592,306 | 6/1986 | Gallego . |
| 4,643,627 | 2/1987 | Bednorz et al. . |
| 4,643,629 | 2/1987 | Takahashi et al. . |
| 4,664,578 | 5/1987 | Kakehi ............... 414/217 |
| 4,670,126 | 6/1987 | Messer et al. . |
| 4,687,542 | 8/1987 | Davis et al. ............... 414/411 X |
| 4,715,921 | 12/1987 | Maher et al. . |
| 4,746,256 | 5/1988 | Boyle et al. ............... 414/225 X |
| 4,764,076 | 8/1988 | Layman et al. ............... 414/222 X |
| 4,775,281 | 10/1988 | Prentakis ............... 414/225 X |
| 4,789,294 | 12/1988 | Sato et al. ............... 414/225 X |
| 4,815,912 | 3/1989 | Maney et al. ............... 414/217 |
| 4,885,050 | 12/1989 | Maher et al. . |
| 5,013,385 | 5/1991 | Maher et al. . |
| 5,308,431 | 5/1994 | Maher et al. . |
| 5,344,542 | 9/1994 | Maher et al. . |

OTHER PUBLICATIONS

Product Information Brochure entitled "Vacuum Cassette Elevator" by Brooks Automation, a Division of Aeronca Electronics, Inc., Billerica, Mass., Mar., 1986.

Product Information Brochure entitled "Vacuum Isolation Valve Six Inches (Trimline)" by Brooks Automation, a Division of Aeronca Electronics, Inc., Billerica, Mass., Mar., 1986.

Novellus Systems, Inc., "Continuous Process CVD System." *Solid State Technology*, vol. 30, No. 10, pp. 49–50 (Oct. 1987).

Applied Materials, "Multi-chamber single wafer CVD System." *Solid State Technology*, vol. 30, No. 10, pp. 55–56 (Oct. 1987).

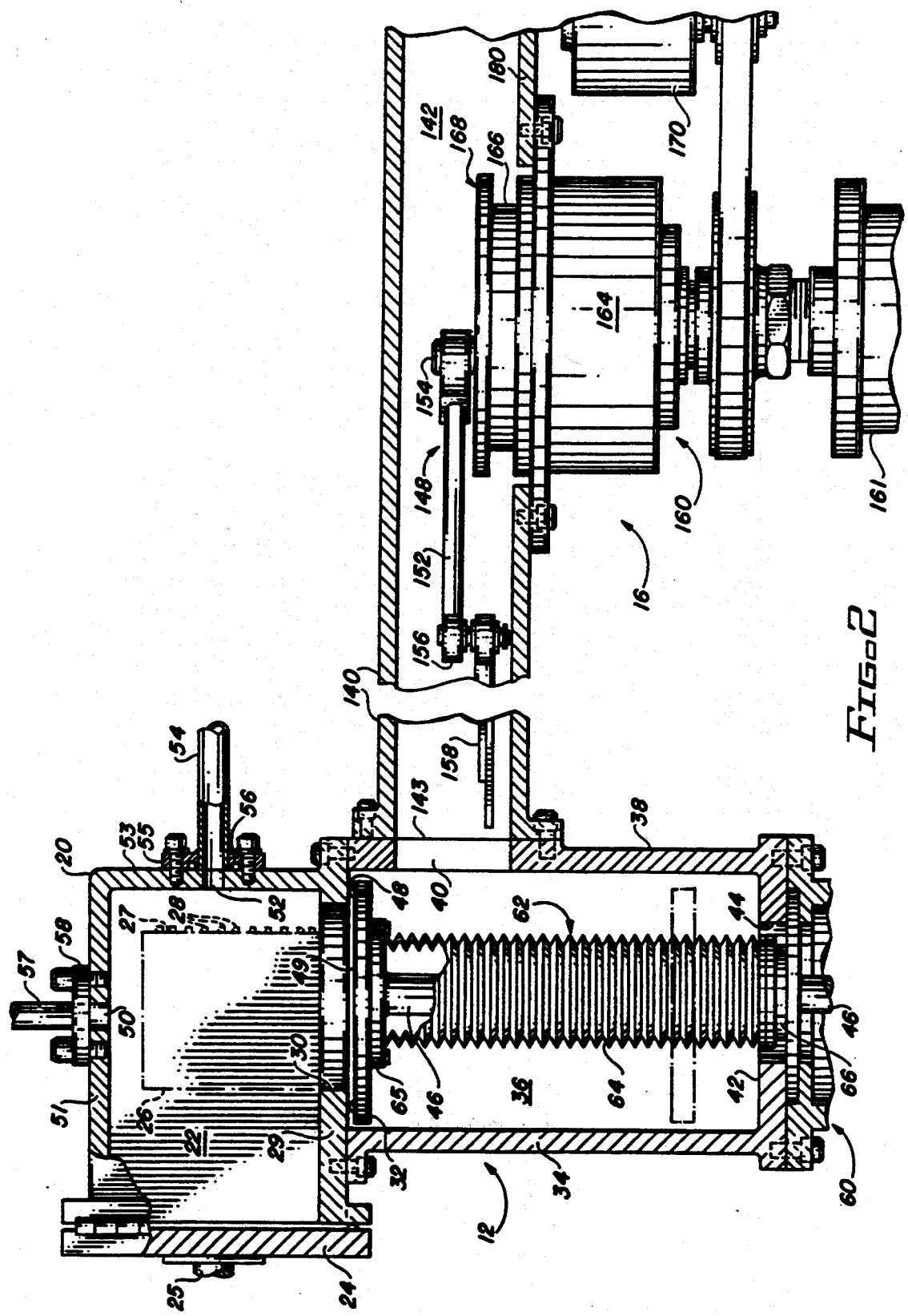

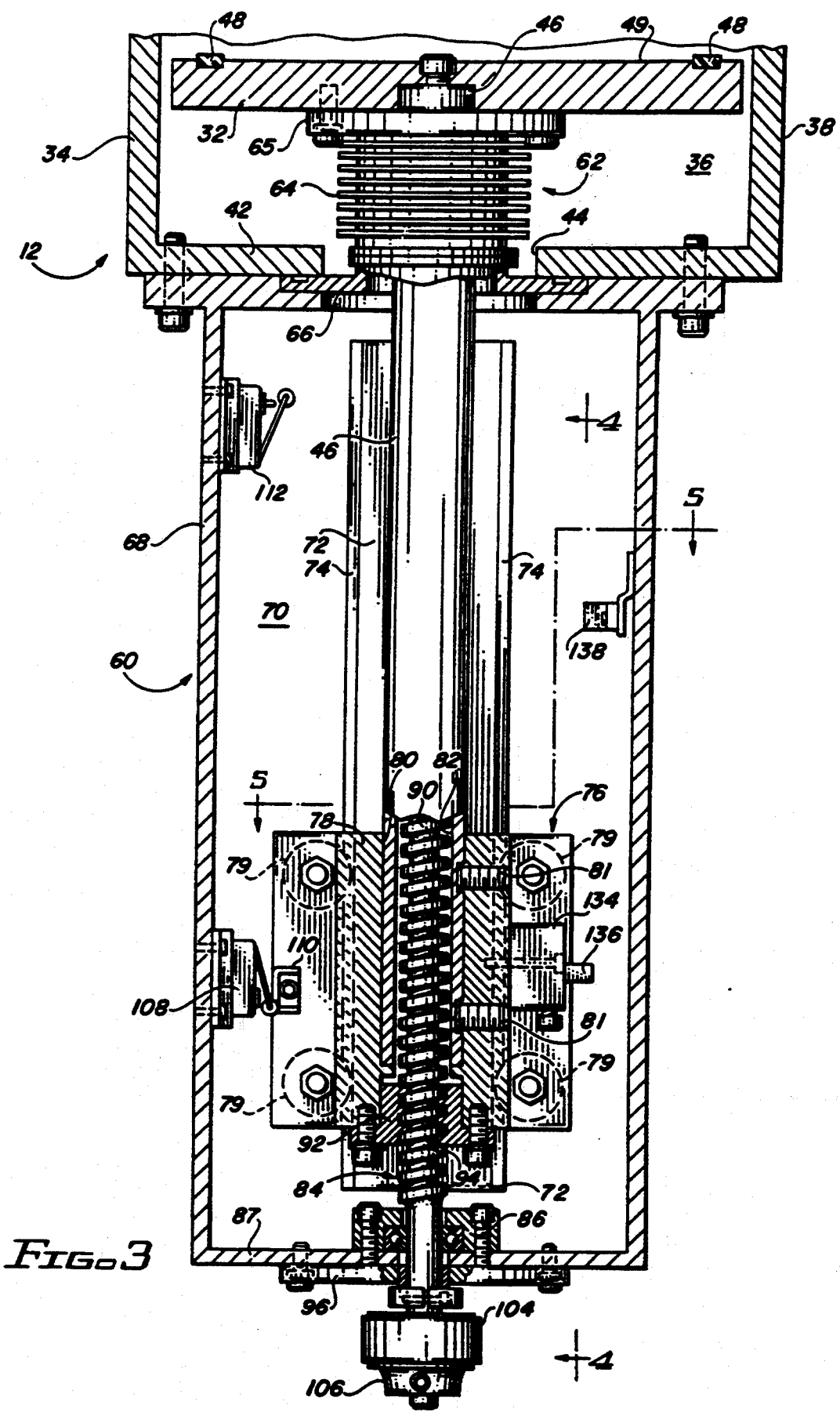

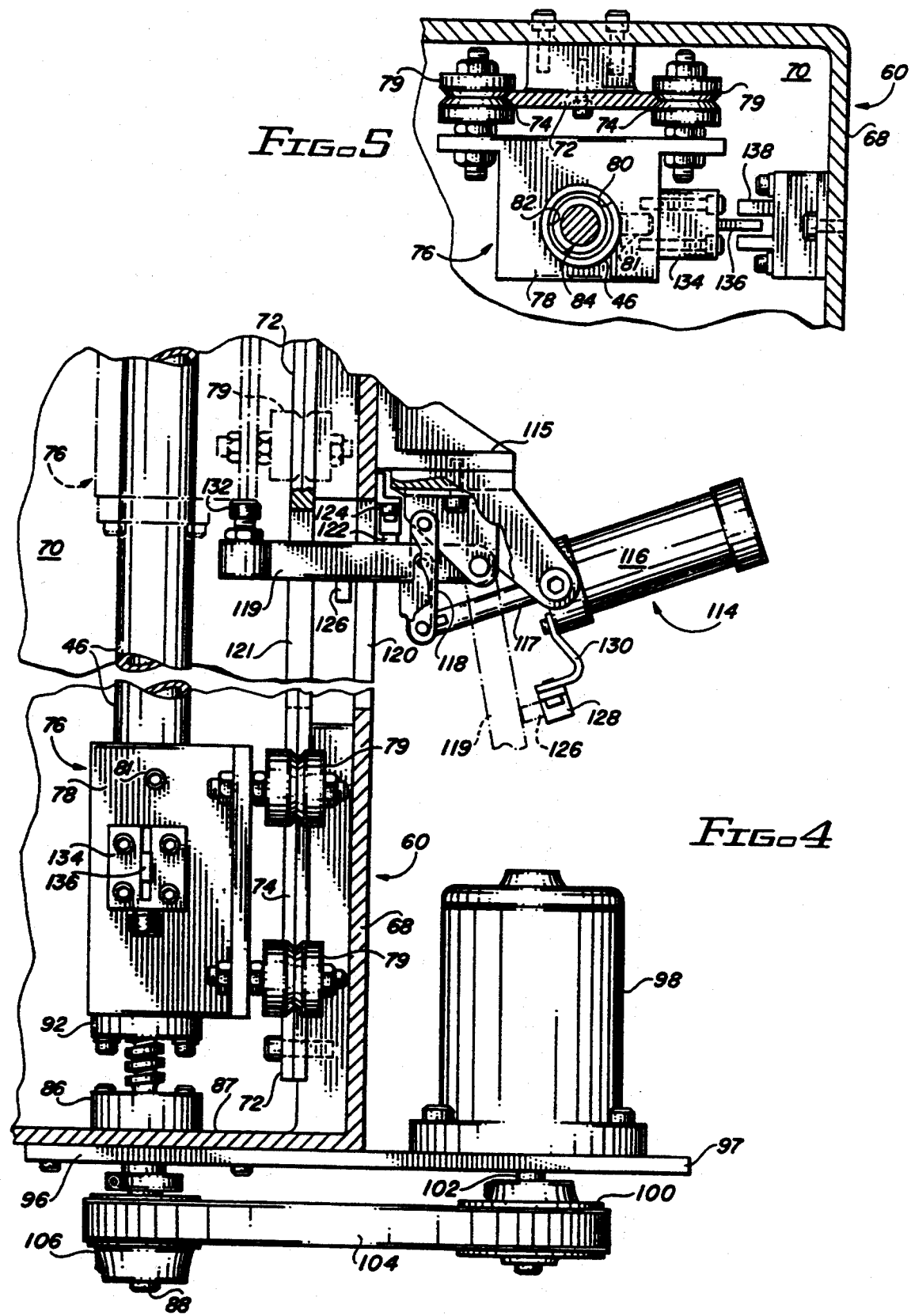

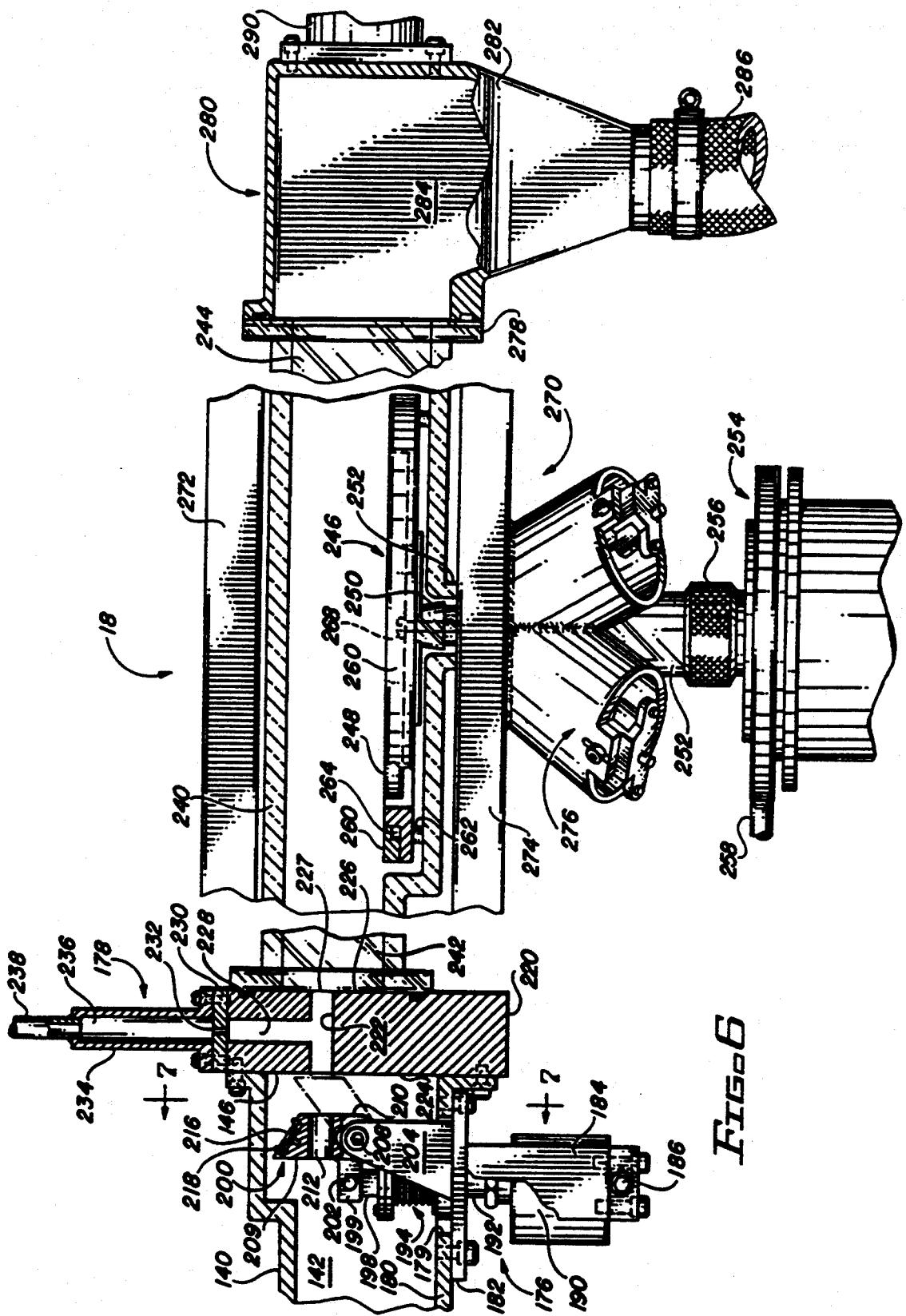

CHEMICAL VAPOR DESPOSITION SYSTEM

CROSS-REFERENCES TO RELATED APPLICATIONS

This application is a continuation of Ser. No. 07/885,124, filed May 18, 1992, entitled "CHEMICAL VAPOR DEPOSITION SYSTEM," now abandoned, which is a continuation of Ser. No. 720,750, now U.S. Pat. No. 5,156,521, filed Jun. 25, 1991, entitled "METHOD FOR LOADING A SUBSTRATE INTO A CVD APPARATUS," which is a continuation of Ser. No. 07/468,572, filed Jan. 23, 1990, now abandoned, which is a divisional of Ser. No. 315,332, now U.S. Pat. No. 5,092,728, filed Feb. 24, 1989, entitled "SUBSTRATE LOADING APPARATUS FOR A CVD PROCESS," which is a divisional Ser. No. 108,771, now U.S. Pat. No. 4,828,224, filed Oct. 15, 1987, entitled "CHEMICAL VAPOR DEPOSITION SYSTEM."

BACKGROUND OF THE INVENTION

1. Field of the Invention

This invention relates in general to systems for chemical vapor deposition of materials on substrates, and more particularly to a chemical vapor deposition system having improved substrate loading, off-loading, and handling sub-systems which interact with at least one especially configured processing subsystem having a reaction chamber, susceptor and heating sub-assemblies for precision control of the deposition process.

2. Discussion of the Related Art

In the electronics art, it has long been a practice to employ chemical vapor deposition techniques for depositing various materials on substrates or wafers, as part of the process for manufacturing semiconductor devices. Chemical vapor deposition processes includes passing of a reactant gas, which contains the material to be deposited, over the substrates for forming, or growing a compound on the substrates as a result of thermal reaction or decomposition of the various gaseous materials.

The equipment used to accomplish such a process is of various configurations but will include the basic components of a reaction chamber, a heating system and a gas flow system. Of course these various components are configured in accordance with the tasks to be accomplished. For example, when the number of substrates to be processed is small, the reaction chamber may be in the form of a bell jar, but in high quantity production work considerably more sophisticated equipment is needed.

For some time now, batch processing equipment has been used for accomplishing the chemical vapor deposition processes in production environments and batch processing equipment may be categorized as being of two basic types, namely horizontal gas flow systems and vertical gas flow systems. A horizontal gas flow system generally includes a platform, or susceptor as it is referred to in the art, which is located in a horizontally disposed reaction chamber with the reactant gas flowing in a horizontal path across the susceptor. In a vertical gas flow system, a horizontally disposed susceptor, or an upstanding multi-surface barrier shaped susceptor, is located in a vertically disposed reaction chamber with the reactant gas being caused to flow in a substantially vertical path and around the susceptor. In either case, these susceptors are configured to support a multiplicity of relatively small substrates, i.e. in the neighborhood of 2 to 5 inches in diameter, for simultaneously depositing, materials on the multiplicity of substrates. While simultaneous deposition of materials on a multiplicity of substrates is desirable from a manufacturing standpoint, it has some drawbacks from a quality standpoint.

The first problem associated with batch, or multi-substrate processing relates to the reactant gas, which contains the atoms of the deposition materials. As the gas flows over the surfaces of the substrates and the susceptor, deposition of the materials results in changes in the concentration of the deposition materials in the reactant gas. Consequently, as the reactant gas flows across or over the length of these relatively large susceptors, across each individual substrate and across a multiplicity of such substrates, different rates of growth of the deposited layer of material have been found. A second problem is that of temperature control which is critical at the elevated temperatures needed for proper deposition. It is difficult, if not impossible, to control the temperature within the critical tolerances at all the desired locations within the relatively large reaction chambers. This results in different deposition layer thickness from one substrate to another, and can even produce varying thickness within the individual substrates. Still another problem is contamination which can result from various factors such as the handling techniques used to load and unload the substrates, the introduction of the reactant gas into the reaction chamber, and the like.

These problems and drawbacks, as well as other factors, all contribute to significant problems as the semiconductor devices and the uses to which they are put become more sophisticated. As a result, many changes and improvements have been made in the equipment that is used to simultaneously process a multiplicity of substrates. For example, some equipment manufacturers are now using automated loading and off-loading devices, as opposed to hand-loading techniques, to eliminate, or at least substantially reduce contamination resulting from human handling. Further, the second type of susceptor discussed above, i.e. the upstanding barrel shaped structure, is being rotated in some instances about its vertical axis to rotate the multiplicity of substrates about that same axis within the reaction chamber. Such barrel rotation is being done for averaging purposes, that is, temperature averaging and reactant gas flow averaging. Obviously these and other things which are being done to improve the simultaneous multi-substrate processing techniques have helped. However, there are practical limits which many feel will ultimately make the batch processing techniques unacceptable or at least undesirable. One of the limitations is that of the equipment not being very well suited for handling larger diameter substrates. The economics of larger diameter substrates are causing many manufactures of semiconductor devices to use larger substrates. However, increasing the size of the substrate is causing some problems with regard to temperature differentials across the substrate, decreasing concentrations of the deposition material as it is carried across the substrate, and the like.

Therefore, steps are being taken now by some equipment manufacturers to make suitable single substrate processing equipment which is significantly simpler in so far as controlling the various factors involved in chemical vapor deposition. Single substrate chemical vapor deposition equipment becomes inherently more desirable than multi-substrate equipment as the manufacturers of semiconductor devices change to larger substrates, i.e. 6 to 8 inches in diameter or even larger. One important consideration is the cost at risk when processing one substrate as opposed to the simultaneous multi-substrate processing. That is, if something goes wrong, the monetary loss is far less with one substrate than it is with a plurality of substrates.

Various prior art components and sub-systems have been devised for use in building single substrate processing chemical vapor deposition systems. For example, loading and unloading of substrates into such systems may be handled in various ways with the most pertinent prior art structure being a cassette elevator available from the Brooks Automation Co., a division of Aeronca Electronics, Inc., One Executive Park Drive, North Billerica, Miss. 01862. The cassette elevator, which is identified as Product No. 6200, includes a vacuum chamber for receiving a plurality of substrates that are carried in a cassette with the cassette being supported on a platform. The platform is vertically movable by means of an elevating mechanism which brings the substrates one at a time into alignment with an access port. An isolation valve such as that available as Product No. 3003 from the above identified Brooks Automation Co., is located at the access port of the elevating mechanism for closing the vacuum chamber except during extraction of the individual substrates. Both the elevating mechanism and the isolation valve provide a controllable environment for receiving and loading the substrates into a processing system.

The Brooks Automation Co. also markets a vacuum transport station under the name Vacu-Tran ™ for extracting the substrates one at a time from the elevating mechanism described above. The transport station includes a housing which is coupled to the isolation valve described above, and a robot arm structure is located in the housing. The robot arm structure includes a rotatable plate having an extensible and retractable arm arrangement thereon, with a pallet or spatula on the distal end of the arms. With the plate and arms rotated so as to align with the access port of the elevating mechanism and the isolation valve open, the arms are extended to move the pallet into position below a substrate, and then the entire arm structure is raised to lift the substrate so that it is carried on the pallet out of the cassette. The arms are then retracted to extract the substrate from the elevating mechanism, and then the arm assembly is rotated to another position and extended once again so as to pass through another isolation valve into a suitable reaction chamber. This particular handling system relies on the weight of the substrate to hold it in place on the pallet and another prior art structure includes a similar arm arrangement which further includes a vacuum outlet on the pallet for a more positive attachment to the underside of the substrates.

The operation of the above described prior art loading system can be reversed for extracting a processed substrate from the reaction chamber and returning it to the same cassette from which it was extracted, or alternatively, to another cassette provided in a second elevating mechanism provided solely for off-loading of processed substrates.

While the above described loading, handling and off-loading structures are significantly better than hand operations, and other prior art loading and handling mechanism which are not relevant to the present invention, they are less than completely satisfactory. One of the prime considerations in modern chemical vapor deposition systems is to hold contamination to an absolute minimum, and prevent it entirely, if possible. In that the vacuum chamber of the elevating mechanism must be opened from time to time for insertion and extraction of cassettes, environmental contamination will enter the vacuum chamber. The isolation valve located at the access port of the elevating mechanism is needed to prevent contaminants from passing through the vacuum chamber of the elevating mechanism into the housing of the transport system during the time when the vacuum chamber is open to the environment, and such an isolation valve is expensive. However, the main problem with this prior art system is in the robot arm structure which slides under and carries the substrates on the pallet from the elevating mechanism to the reaction chamber and back again when processing is completed. First of all, such a substrate handling technique cannot possibly place a substrate on a flat continuous surface, such as an ideally configured susceptor, which is used in the reaction chamber, due to the pallet of the robot arms being in supporting engagement with the bottom surface of the substrate. Therefore, some sort of less than ideal susceptor configuration must be provided in the reaction chamber if is it is to be used with the prior art robot arm handling mechanisms. Secondly, damage often results from the pallet coming into mechanical contact with the substrate. Also, contaminants in the form of airborne particles can settle on the top surface of the substrate and this reduces the yield of the substrates and destroys circuit integrity.

As was the case with the above discussed batch processing chemical vapor deposition systems, the reaction chambers used in single substrate processing systems may be categorized as either a horizontal gas flow system or a vertical gas flow system. However, the susceptors being used in the single substrate reaction chambers consist essentially of a planar platform or base upon which the substrate rests during the deposition process, and those susceptors contribute nothing further to the deposition process with regard to improving the problems of depletion of the material carried by the reactant gas as it flows past and around the substrate, and with regard to improved temperature sensing and control.

Therefore, a need exists for a new and improved single substrate chemical vapor deposition system which enhances the process and thereby helps in eliminating, or at least reducing, the problems and shortcomings of the prior art systems.

SUMMARY OF THE INVENTION

In accordance with the present invention, a new and improved chemical vapor deposition system is disclosed for depositing various materials on substrates as part of the process for manufacturing semiconductor devices. The present system is broadly categorized as a horizontal gas flow system in that the reactant gas which carries the materials to be deposited, is directed in a horizontal flow path through the reaction chamber in which the substrates are processed. Also, the system is further categorized as a single substrate processing system as opposed to a batch processing system, in that one relatively large substrate is processed per cycle of the system. However, as will be seen, the system of the present invention is configured so that a plurality of independent single substrate processing cycles can be simultaneously accomplished.

The chemical vapor deposition system of the present invention includes the following major sub-systems. A special substrate loading sub-system is provided for receiving cassettes which carry a multiplicity of substrates to be processed, and an identical off-loading sub-system is provided for receiving processed substrates that are to be removed in cassettes from the system. Both the loading and off-loading sub-systems include a unique built-in isolation valve which closes off the rest of the system from environment contamination whenever these sub-systems are opened for insertion for removal of the cassettes.

A special substrate handling sub-system, as fully disclosed in U.S. Pat. No. 5,080,549, issued Jan. 14, 1992, entitled WAFER HANDLING SYSTEM WITH BERNOULLI PICK-UP, which is hereby expressly incorporated herein by reference, includes a housing having a loading port to which the substrate loading sub-system is coupled and an unloading port to which the off-loading sub-system is coupled. A special robot arm assembly is mounted in the housing for rotary and extensible movements for substrate handling purposes. A pick-up wand is mounted on the distal end of the robot arms for positioning above the substrates to be handled, and a special gas flow arrangement is provided in the robot arm assembly so that the pick-up wand operates in accordance with Bernoulli's principle for moving the substrates within the system without any mechanical contact being made with the top or bottom planar surfaces of the substrates. In addition to the loading and unloading ports, the housing of the substrate handling sub-system is provided with a delivery port through which substrates are supplied to and retrieved from a processing sub-system which is coupled to the delivery port. The housing may be provided with a plurality of such delivery ports to which an equal number of processing sub-systems are coupled.

In any event, a special isolation valve assembly having a ported gate valve is mounted proximate delivery port of the housing for closing that delivery port whenever a chemical vapor deposition cycle is being accomplished in the processing sub-system. Also, a gas injection structure, as fully disclosed in U.S. Pat. No. 5,221,556, issued Jun. 22, 1993, entitled GAS INJECTORS FOR REACTION CHAMBERS IN CVD SYSTEMS, which is hereby expressly incorporated by reference, is interposed between the isolation valve assembly and the inlet of the processing sub-system. The gas injector is configured to provide a reactant gas flow of special character through the reaction chamber.

The processing sub-system in which the chemical vapor deposition process takes place, includes a reaction chamber which is fully disclosed in U.S. Pat. No. 4,846,102, issued Jul. 11, 1989, entitled REACTION CHAMBERS FOR CVD SYSTEMS, which is expressly incorporated herein by reference. The reaction chamber is especially configured to provide desirable gas flow characteristics for accomplishing the deposition process in a precisely controllable environment. The reaction chamber housing is also configured for mounting of a special substrate supporting mechanism with temperature sensing devices therein.

U.S. Pat. No. 4,821,674, issued Apr. 18, 1989, entitled ROTATABLE SUBSTRATE SUPPORTING MECHANISM WITH TEMPERATURE SENSING DEVICES FOR USE IN CHEMICAL VAPOR DEPOSITION EQUIPMENT, is hereby expressly incorporated herein by reference. This sub-system is designed for optimum temperature averaging and control, and for reactant gas flow averaging, and includes a circular susceptor for supporting a single substrate, with the susceptor being disposed within the reaction chamber on a driveshaft assembly which axially depends from the susceptor through a depending tubular shaft of the reaction chamber housing. The driveshaft assembly is rotatably drivable for rotation of the susceptor and thus the single substrate supportable thereon. The critical temperatures at various points of the susceptor are sensed by a special temperature sensing arrangement which includes a master temperature sensor that is located in the vicinity of the center of the susceptor. A special fixed ring, is located in concentric relationship with the rotatable susceptor, and plurality of, slave temperature sensors are located in the fixed ring for sensing the temperatures at various points near the periphery of the susceptor. The master and slave temperature sensors produce signals indicative of the temperatures sensed thereby, and the signals are transmitted to a suitable temperature control means.

The processing sub-system of the chemical vapor deposition system of this invention further includes a heating system that is fully disclosed in U.S. Pat. No. 4,836,138, issued Jun. 6, 1989, entitled HEATING SYSTEM FOR REACTION CHAMBER OF CHEMICAL VAPOR DEPOSITION EQUIPMENT, that is hereby expressly incorporated herein by reference. The heating system includes an upper radiant heat assembly which is disposed atop the reaction chamber for directing radiant heat downwardly into the chamber a lower radiant heat assembly is located below the reaction chamber for directing heat upwardly into the chamber. A heat concentrator structure which is part of the lower heating assembly, is provided for directing concentrated radiant heat into the vicinity of the center of the susceptor where the master temperature sensor is located, with the heat concentrator providing optimum temperature control. The upper and lower heating structures have individually controllable banks of discrete heating elements for precision heat control of the various regions in and about the rotatable susceptor.

In addition to the above, the system of the present invention is provided with various purging sub-systems for controlling the gas flow within the system and maintaining a contaminant free environment therein.

Accordingly, it is an object of the present invention to provide a new and improved chemical vapor deposition system for continuous and sequential handling and processing single substrates for depositing various materials thereon as part of a semiconductor manufacturing process.

Another object of the present invention is to provide a new and improved chemical vapor deposition system which includes special substrate loading and unloading sub-systems wherein cassettes containing multiplicities of substrates are inserted into the system for processing and retrieved from the system subsequent to processing with the loading and unloading sub-systems eliminating, or at least substantially reducing, system contamination resulting from the insertion and retrieval of the cassettes.

Another object of the present invention is to provide a new and improved chemical vapor deposition system having a special substrate handling system including a special robot arm structure which moves the substrates in the system without coming into physical contact with the top and bottom planar surfaces of the substrates.

Another object of the present invention is to provide a new and improved chemical vapor deposition system of the above described character wherein the substrate handling sub-system is operable for moving individual substrates from the loading sub-system into a desired one of a plurality of processing sub-systems for processing and retrieving the substrates after processing and delivering the processed substrates to the unloading sub-system.

Another object of the present invention is to provide a chemical vapor deposition system which includes ported gate valves which isolates the substrate handling sub-system from the processing sub-systems at all times except when substrates are being inserted into or retrieved from the processing sub-systems.

Another object of the present invention is to provide a new and improved chemical vapor deposition system which further includes special gas injectors for inducing special flow characteristics in the gas that is supplied to the processing sub-systems.

Another object of the present invention is to provide each of the processing sub-systems of the system with a reaction chamber housing that induces desired gas flow characteristics through the reaction chamber and is configured to accommodate a special susceptor and heat sensing sub-system.

Another object of the present invention is to provide a new and improved chemical vapor deposition system of the above described character wherein a circular susceptor is mounted in the reaction chamber for supporting a single substrate, with the susceptor being rotatably driven to rotate the substrate about an axis which is normal with respect to the center thereof for optimum averaging of temperature differences and material concentration differences in the reactant gas to eliminate, or at least substantially reduce, the undesirable effects of those variables on the deposition process.

Another object of the present invention is to provide a new and improved chemical vapor deposition system wherein a special temperature sensing arrangement is provided to sense the temperatures in and about the rotatable susceptor and producing signals which are used for controlling the heat input to the various regions in and about the susceptor.

Another object of the present invention is to provide a new and improved chemical vapor deposition system of the above described character which further includes a special heating sub-system which is controllable to direct variable amounts of radiant heat energy into the reaction chamber for optimized heating of the various regions in and about the rotatable susceptor.

Another object of the present invention is to provide a new and improved chemical vapor deposition system of the above described type wherein purging sub-systems are provided at various points in the system for controlling gas flow within the system and for maintaining a contaminant free environment within the system.

Still another object of the present invention is to provide a new and improved mechanism for loading various articles into a processing system, or retrieving various articles from a processing system, with the mechanism including a built-in isolation valve which prevents environmental contamination of the processing system.

Yet another object of the present invention is to provide a new and improved isolation valve for use between various sub-systems of a processing system for selective isolation of the sub-systems.

The foregoing and other objects of the present invention as well as the invention itself, will be more fully understood from the following description when read in conjunction with the accompanying drawings.

BRIEF DESCRIPTION OF THE DRAWINGS

FIG. 2 is an enlarged fragmentary sectional view taken along the line 2—2 of FIG. 1.

FIG. 3 is an enlarged fragmentary sectional view taken along the line 3—3 of FIG. 1.

FIG. 4 is a fragmentary sectional view taken along the line 4—4 of FIG. 3.

FIG. 5 is a fragmentary sectional view taken along the line 5—5 of FIG. 3.

FIG. 6 is a fragmentary sectional view taken along the line 6—6 of FIG. 1.

DESCRIPTION OF THE PREFERRED EMBODIMENTS

Figure 1:
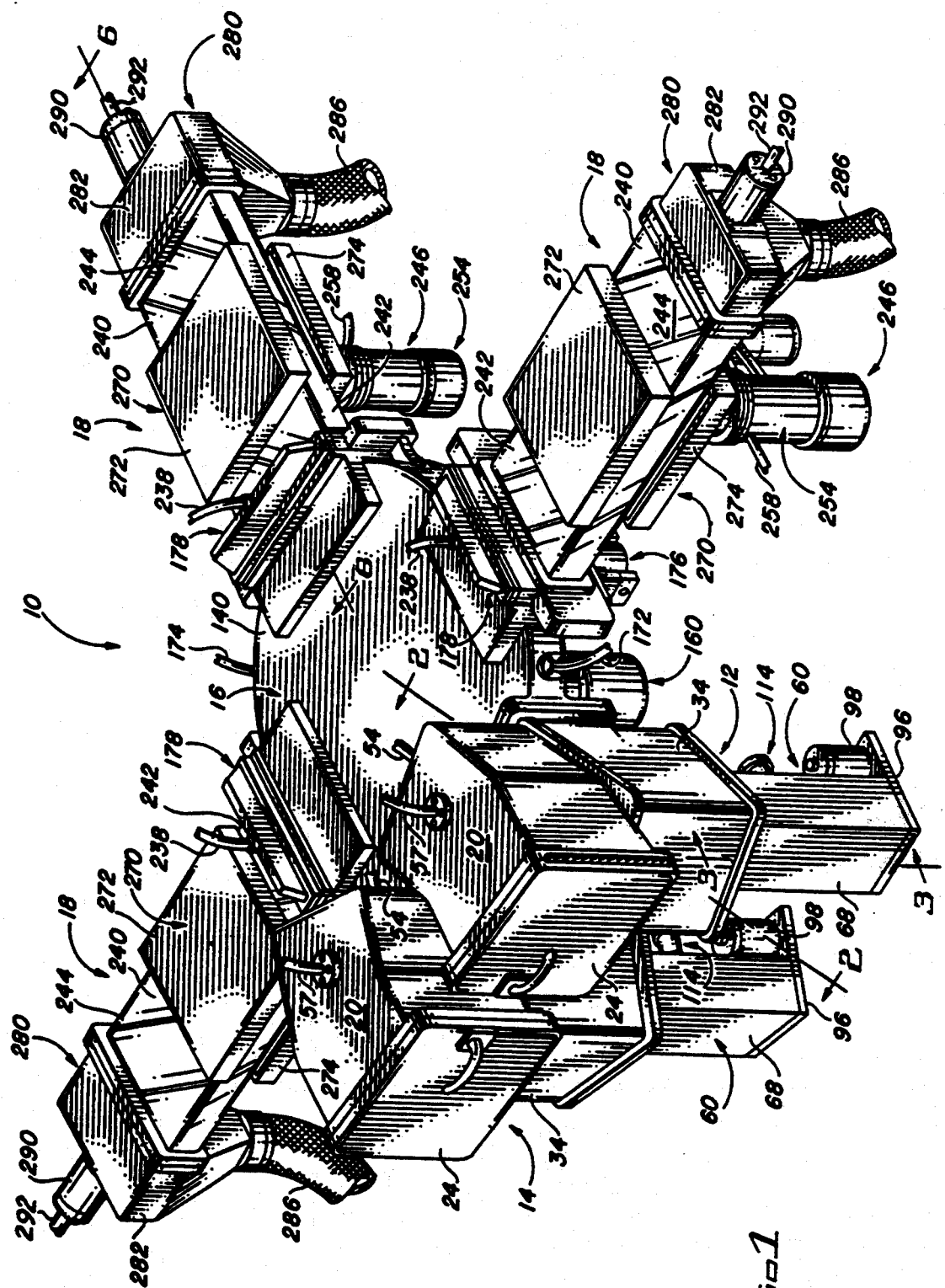
FIG. 1 is a perspective view of the chemical vapor deposition system of the present invention which shows some of the various features thereof.
Figure 8:
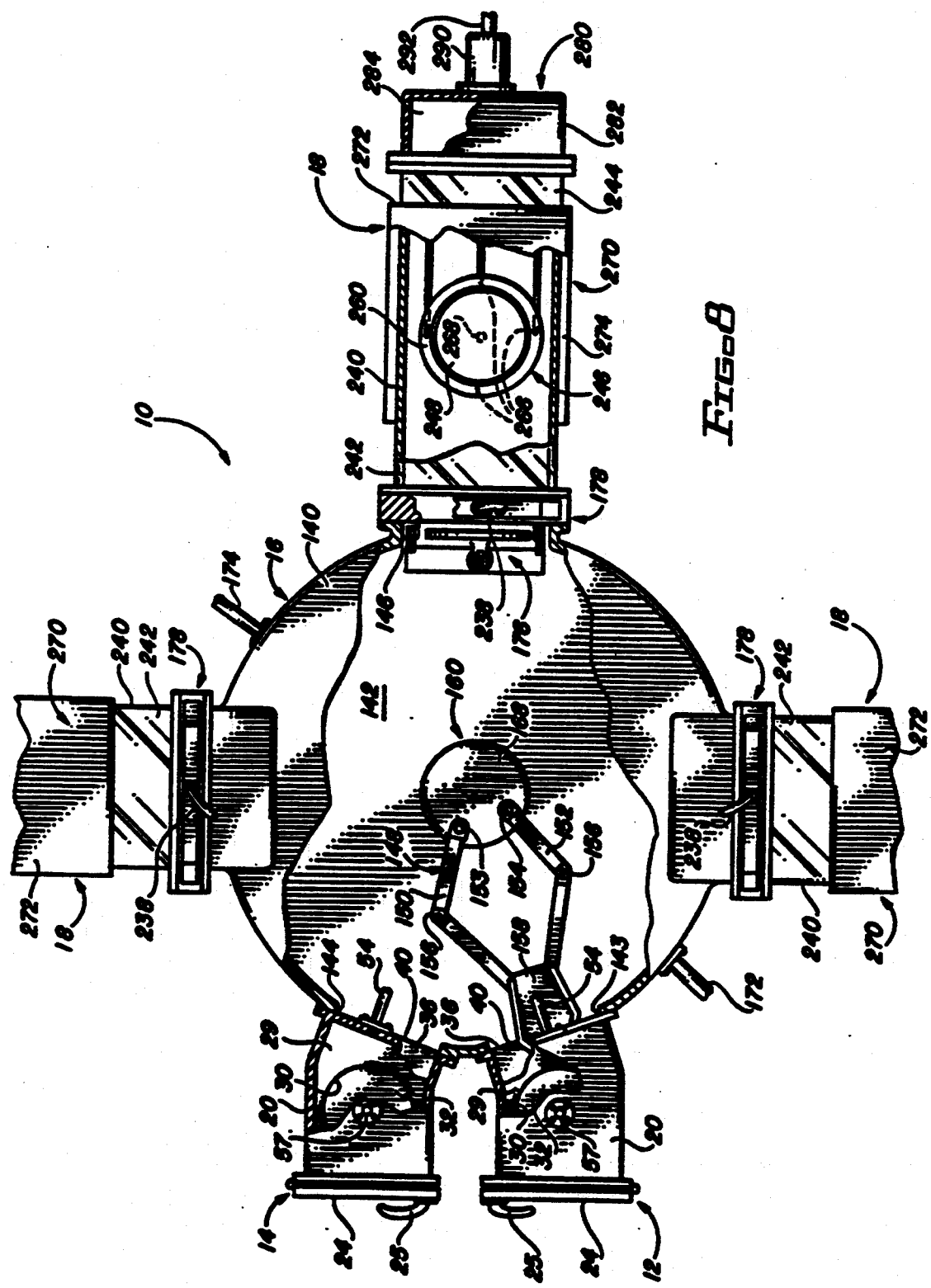
FIG. 8 is a schematic plan view of the system of the present invention which is partially broken away to show the various relationships and features of the sub-systems and components thereof.

Referring more particularly to the drawings, FIGS. 1 and 8 best show the chemical vapor deposition system of the present invention which is indicated in its entirety by the reference numeral 10. As will hereinafter be described in detail, the system 10 is formed of several sub-systems which includes a substrate loading sub-system 12, an identical substrate unloading sub-system 14, a substrate handling sub-system 16. In the illustrated embodiment, three identical processing sub-systems 18 are shown, but it will be understood that the deposition system 10 is completely operational with a single processing sub-system 18, and additional processing sub-systems 18 are employed, if desired, for production purposes.

As mentioned above, the loading and unloading sub-systems 12 and 14 respectively, are identical with the difference being in the way that they are operated. Since the sub-systems 12 and 14 are identical, it will be understood that the following detailed description of the loading sub-system 12 will also apply to the unloading sub-system 14.

As seen best in FIGS. 1, 2, 3, 4 and 5, the substrate loading sub-system 12 includes an upper housing 20 which defines a hermetically sealable cassette receiving interior chamber 22. The upper housing 20 has a hatch 24 which is hingedly mounted on the housing 20 with a suitable latch 25 being provided for opening the hatch so that a cassette 26, which is shown in dashed lines in FIG. 2, may be placed in and retrieved from the interior cassette receiving chamber 22. The cassette 26, as is well known in the art, is a case-like structure having an open side 27 with a plurality of shelf-like supports (not shown) therein for containing and providing lateral access to a plurality of substrates 28 that are carried in vertically spaced stacked relationship with the cassette 26. The upper housing 20 includes a floor 29 having a large central opening 30 formed therethrough with that opening being closed by a cassette support platform 32 whenever a cassette 26 is being loaded into or unloaded from the receiving chamber 22, as will hereinafter be described.

The loading sub-system 12 further includes an intermediate housing 34 which is bolted or otherwise attached so as to be immediately below the upper housing 20, and is configured to define an interior feed chamber 36. The intermediate housing 34 is open at its top end so that the floor 29 of the upper housing 20 forms the top wall of the intermediate housing 34, with the central opening 30 of the floor 29 being located so as to open into the feed chamber 36. The intermediate housing 34 further includes a sidewall 38 having a lateral feed port 40 formed therein, and a bottom wall 42 which is provided with a central opening 44 that is in axial alignment with the central opening 30 of the upper housing 20.

The cassette support platform 32 is mounted on the upper end of an elevator shaft 46 for vertical movement between an elevated position shown in solid lines in FIG. 2, and a fully lowered position shown in phantom lines in the same figure. The support platform 32 has a seal means 48 such as an O-ring mounted thereon to extend upwardly from its top surface 49. Therefore, when the support platform 32 is fully elevated, the seal means 48 engages the lower surface of the floor 29 about the central opening 30 thereof so that the receiving chamber 22 of the upper housing 20 is hermetically sealed from the feed chamber 36 of the intermediate housing 34 when the cassette support platform 32 is in the elevated position.

Therefore, the floor 29 with its central opening 30 and the vertically movable cassette support platform 32 cooperate to provide the loading sub-system 12 with a built-in isolation valve which isolates the feed chamber 36 of the intermediate housing 34 from the cassette receiving chamber 22 of the upper housing 20. Such isolation is provided so that whenever the hatch 24 is opened for loading or retrieval of a cassette 26, environmental contamination will be kept out of the feed chamber 36 of the intermediate housing 34 and thus out of the rest of the system 10 as will become apparent as this description progresses.

However, environmental contamination will enter the cassette receiving chamber 22 of the upper housing 20 during loading and unloading operations. Therefore, the upper housing 20 is provided with a purge gas inlet port 50 in its top wall 51 and a purge gas outlet port 52 in one of its sidewalls 53. As seen in FIG. 2, the purge gas outlet port 52 is coupled to a suitable gas disposal location (not shown) by an exhaust tube 54 which is welded or otherwise fixedly attached to a mounting plate 55 that is bolted to the housing 20 and has a suitable O-ring seal 56. The purge gas inlet port 50 is similarly coupled to a remote source of pressurized purge gas (not shown) by a supply tube 57 with a similar mounting plate 58.

As will hereinafter be described in detail, an elevator means 60 is mounted below the intermediate housing 34 with the above mentioned elevator shaft 46 extending therefrom so as to pass axially through the opening 44 provided in the bottom wall 42 of the intermediate housing 34. In addition to passing axially through the opening 44, the top end of the elevator shaft 46 is axially disposed in a bellows seal assembly 62 of the type well known in the art. The bellows seal assembly 62 includes an axially extensible bellows 64 having an upper mounting plate 65 which is attached to the lower surface of the cassette support platform 32 and a lower mounting plate 66 which is attached in the manner shown to the bottom wall 42 of the intermediate housing 34. In this manner, the feed chamber 36 is isolated from the elevator means 60 to prevent any contamination from entering the feed chamber 36 from the elevator means 60.

The elevator means 60 includes an elongated housing 68 that is bolted or otherwise attached so as to be supported and depend from the intermediate housing 34, with the housing 68 defining an internal chamber 70. An elongated guide rail 72 is mounted within the elevator housing 68 with a pair of tracks 74 being formed on its opposed longitudinal edges, and an elevator carriage 76 is mounted for vertical reciprocal movement on the guide rail. The carriage 76 includes a housing 78 with suitable wheels 79 mounted thereon which engage the tracks 74 of the guide rail 72. The elevator shaft 46 is fixedly carried in a bore 80 formed in the carriage such as by the illustrated set screws 81 and the elevator shaft defines an axial bore 82 with an open lower end. An elongated lead screw 84 is journaled for rotation in a bearing assembly 86 that is suitably mounted in the bottom wall 87 of the elevator housing 68 so that the lower end 88 of the lead screw 84 depends axially from the housing 68, and the upper threaded end 90 extends axially upwardly through the bore 80 of the carriage housing 78 so as to be axially disposed in the bore 82 of the elevator shaft 46. A follower nut 92 is bolted or otherwise affixed to the lower end of the carriage housing 78 so that it's internally threaded bore 94 is in threaded engagement with the lead screw 84.

A plate 96 is mounted on the lower surface of the bottom wall of the elevator housing 68 and the plate 96 has a laterally extending portion 97 upon which a drive motor 98 is mounted. The drive motor 98 is an electrically and reversibly operated digital stepping motor of the type well known in the art, and has a drive pulley 100 mounted for rotation with its output shaft 102. A suitable drive belt 104 is employed for coupling the drive pulley 100 of the motor 98 to a driven pulley 106 that is mounted fast on the depending lower end 88 of the lead screw 84.

When the drive motor 98 is operated, the lead screw 84 will be rotated about its longitudinal axis with the follower nut 92 causing the carriage 76 to move along the guide rail 72 either upwardly or downwardly as determined by the rotational direction of the drive motor 98. When the carriage 76 is in its lowered position as shown in FIG. 3, the cassette support platform 32 will be lowered, and the carriage is upwardly movable to raise the cassette support plate 32 to its upper position wherein it performs the above described isolation valve function.

As seen in FIG. 3, a lower limit switch 108 is mounted in the elevator housing 68 for engaging a suitable switch actuator arm 110 that is mounted on the carriage housing 78. The lower limit switch 108 is used as an emergency stopping device which prevents the carriage from moving below a desired lower limit. An upper limit switch 112 is similarly mounted in the elevator housing 68 for contact by the same switch actuator arm 110 when the carriage 76 reaches its upper position. In addition to limiting the upward movement of the carriage 76, the upper limit switch 112 produces a signal indicative of the up-position of the substrate support platform 32 and that signal is used by a suitable control means (not shown) to actuate a latching means 114 which is shown in FIG. 4. The illustrated latching mechanism 114 is a commercially available power clamp that is marketed by the DE-STA-CO division of Dover Resources, Inc., 250 Park Street, Troy, Mich. 48007-2800. The latching mechanism 114, which is identified as Model No. 807-L, is mounted on the exterior of the elevator housing 68 by being bolted to a mounting bracket 115 that is provided on the housing for that purpose. The latching mechanism 114 includes a pneumatic (or hydraulic) cylinder 116 having the usual reciprocally extensible rod 117 which operates an over-center linkage 118 for moving a clamping arm 119 back and forth through an opening 120 formed in the housing 68 and an aligned opening 121 formed through the guide rail 72. The clamping arm 119 is movable from a carriage latching position shown in solid lines in FIG. 4 to a carriage releasing position shown in dashed lines in the same figure. The clamping arm 119 is especially configured to provide a first indicator lug 122 which interacts with a first detector switch 124, such as an optical sensor, to produce a control signal indicative of a latched position of the arm 119. A second indicator lug 126 is also provided on the arm 119 to interact with a second detector switch 128, that is mounted on the cylinder 116 by means of a suitable bracket 130, to provide a control signal that is indicative of the unlatched position of the clamping arm 119.

The latching mechanism 114 is operable to clamp and hold the cassette support platform 32 in sealed engagement with the floor 29 of the upper housing 20 by bearing engagement of the adjustable bolt 132 that is mounted on the distal end of the clamping arm 119 with the lower end of the carriage 76, as indicated in FIG. 4. By virtue of the over-center linkage 118, the power clamp 114 will maintain the latched position of the arm 119 despite power failures, equipment shut-down and the like to prevent system contamination during such periods as well as during operation.

As seen best in FIGS. 3 and 5, another position indicator is provided in the elevator means 60, and includes a mounting assembly 134 for adjustably carrying a lug 136. A sensor device 138, such as an optical sensor, is mounted in the housing 68 so as to interact with the lug 138 to produce a control signal indicative of the alignment of the lowermost substrate 28 in the cassette 26 with the feed port 40 of the intermediate housing 34.

When a cassette 26 containing substrates 28 to be sequentially processed in the system 10, has been loaded into the receiving chamber 22 of the upper housing 20, and that chamber has been subjected to a purging operation, the latching mechanism 114 is operated to move the latching arm 119 to its unlatched position. Then, the drive motor 98 is operated in a stepping manner to lower the carriage 76 and support platform 32. When the position indicator lug 136 is aligned with the sensing switch 138, the resulting control signal is supplied to a control system (not shown) which sequentially lowers the support platform 32, and therefore the cassette 26, to sequentially move the substrates into the desired position relative to the feed port 40 of the intermediate housing 34.

As shown, the loading sub-system 12 is mounted on the substrate handling sub-system 16 which, as will hereinafter be described, is operated to extract the substrates 28 from the loading sub-system 12 for sequential processing in the system 10. The substrate unloading sub-system 14 is similarly mounted on the handling sub-system 16 for receiving the processed substrates from the system for unloading therefore, the unloading sub-system 14 which is identical to the loading sub-system 12, is operated in a reversed manner to accomplish the processed substrate unloading operation.

The substrate handling sub-system 16, as hereinbefore stated, is fully disclosed in U.S. patent application Ser. No. 048,630, filed May 11, 1987, which is expressly incorporated herein by reference. However, to insure a complete understanding of the chemical vapor deposition system 10 of the present invention, a brief description of the handling sub-system 16 will now be presented.

With special reference to FIGS. 1, 2 and 8, the substrate handling sub-system 16 is shown as including a housing 140 which defines an internal chamber 142. The housing 140 includes a suitable substrate input port 143 which is aligned with the feed port 40 of the substrate loading sub-system 12, and a substrate output port 144 that is aligned with the feed port 40 of the substrate unloading sub-system 14. As will hereinafter be described in detail, the housing 140 is also provided with at least one substrate delivery port 146 through which substrates to be processed are passed into the processing sub-system(s) 18. The moving of the substrates from the loading sub-system 12 into the processing sub-system 18, and movement of processed substrates from the sub-system 18 into the unloading sub-system 14, is accomplished by a special wafer handling mechanism 148 having a pair of articulated robot arms 150 and 152 each having a proximal end mounted for rotational movement about drive shafts 153 and 154, respectively. Each of the arms 150 and 152 also have an intermediate joint 156 with a special pick-up wand 158 being mounted on the distal ends of the arms. The arm drive-shafts 153 and 154 are driven in opposite rotational directions for extending and retracted folding movements of the robot arms 150 and 152 to move the pick-up wand toward and away from the uppermost end of a robot arm drive assembly 160 upon which the proximal ends of the arms are mounted and which drives the robot arms. The drive assembly 160, as seen in FIG. 2, includes a first drive motor 161 which rotatably drives a center shaft (not shown) that extends upwardly from the motor 161 through the center of a coaxial bearing and seal mechanism 164 and drives the internal gears (not shown) of a gear box 166 for rotational driving of the drive shafts 153 and 154. A second motor 170 is provided which rotatably drives a tubular shaft (not shown), that is concentrically disposed about the above-described center shaft, and also extends through the mechanism 164 for rotation of the entire gear head 168. The gear head 168 is therefore rotatable for selected positioning of the robot arms 150 and 152 in alignment with the various ports 143, 144 and 146 of the housing 140 by operation of the motor 170. When in any of these aligned positions, the other drive motor 160 is operated for foldingly extending and retracting the robot arms 150 and 152 to move the pick-up wand 158 to the desired locations for picking up and delivering the substrates 28.

The pick-up wand 158 operates in accordance with the Bernoulli principle to produce an area of relatively low pressure between the downwardly facing surface of the wand 158 and the upwardly facing surface of the substrate to be moved. In this manner, the pick-up wand 158 can lift and move the substrates 28 without ever touching the top or bottom planar surfaces of the substrate. The only physical contact between the wand 158 and the substrates is an edge contact which is made so that the substrates will move along with the wand. The pick-up wand 158 is provided with a special array of gas outlet apertures (not shown) which open onto the lower surface of the pick-up wand with those apertures being coupled to a remote source of gas under pressure (not shown). The connection of the wand to a remote source of gas is made via passages formed through the robot arms 150 and 152 and downwardly through the drive assembly 160.

In addition to the gas which enters the housing 140 of the substrate handling sub-system 16 from the pick-up wand 158, the housing is provided with a purge gas inlet 172 and a purge gas outlet 174 which may be coupled to the same sources and disposal location as the drive assembly 160 and the loading and unloading sub-systems 12 and 14.

As will hereinafter be described, the substrate handling sub-system 16 moves the substrates to be processed through a special isolation valve 176 and gas injector 178, as seen in FIG. 6, into the processing sub-system 18. It also, of course retrieves the processed substrates by moving the back through the gas injector 178 and isolation valve 176 when processing is completed.

Figure 7:
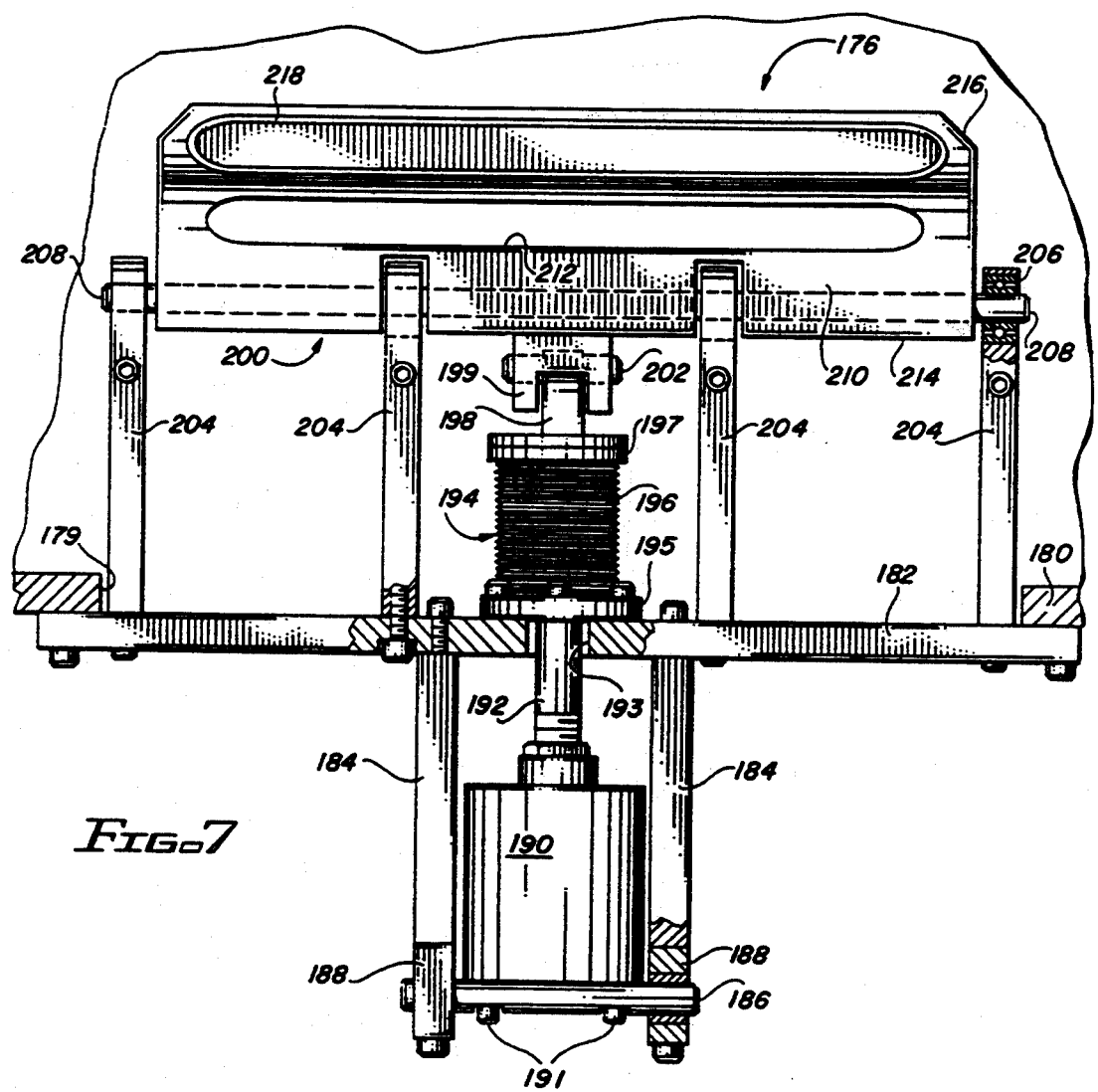
FIG. 7 is an enlarged fragmentary sectional view taken along the line 7—7 of FIG. 6.

The housing 140 of the substrate handling sub-system 16, as shown in FIGS. 6 and 7, is provided with an opening 179 in it's bottom surface 180 adjacent it's delivery port 146, and the isolation valve 176 is mounted in that opening so as to be disposed in the housing 140 proximate the delivery port 146. The isolation valve 176 includes a mounting plate 182 that is bolted or otherwise attached to the bottom surface 180 of the housing 140 so as to hermetically seal the opening 179 and support the various components of the isolation valve. A pair of actuator support arms 184 depend from the mounting plate 182 in spaced apart relationship with respect to each other, and a rock shaft 186 is transversely journaled for rotation in bushing blocks 188 that are mounted on the lower ends of the actuator support arms 184. A pneumatic actuator means 190 is mounted such as by the cap screws 191 to the rock shaft 186 for movement herewith, and the reciprocally extensible rod 192 of the actuator 190 extends upwardly through an opening 193 formed in the mounting plate 182. A bellows seal 194 of the type well known in the art is concentrically disposed about the extensible rod 192 of the actuator 190 to hermetically seal the opening 193 through which the extensible rod 192 extends. The bellows seal 194 has the usual lower mounting flange 195 that is sealingly attached to the upper surface of the mounting plate 182 about the opening 193 thereof, and an extensible bellows 196 that extends upwardly about the actuator rod 192. An upper mounting flange 197 of the bellows seal 194 is suitably attached to the actuator rod 192 proximate it's upper end 198 which is connected to a clevis 199 of a valve body 200 by a pivot pin 202.

A plurality (four shown) of valve body support arms 204 are mounted so as to extend upwardly from the mounting plate 182 in spaced apart relationship with respect to each other. Suitable bearings 206 (one shown) are mounted in the top end of each of the support arms 204 for journaling of a pivot axis 208 which is mounted in the valve body 200. The valve body 200 is of elongated configuration having opposed planar surfaces 209 and 210 with an elongated open port 212 extending transversely through the body so as to open onto both of the opposed planar surfaces 209 and 210. The pivot axis 208 extends longitudinally through the valve body 200 proximate the side edge 214 thereof with the opposite longitudinal side edge forming a valve closing surface 216. As shown best in FIG. 6, the valve closing surface 216 is disposed to form an acute angle of approximately 30–40 degrees with respect to open port 212 thereof. An O-ring type sealing gasket 218 is provided on the valve closing surface 216 of the valve body 200.

When the actuator 190 is in it's retracted state, the valve body 200 will be in the solid line position as shown in FIG. 6, with this position being referred to as the open position of the isolation valve 176. When in this open position, the open port 212 will be disposed in parallel relationship with the mounting plate 182 so that the distal ends of the robot arms 150 and 152 and the wand 158, along with the substrates carried thereby, can be moved through the port 212 of the valve body 200. When the actuator 190 is opened to move the extensible rod 192 to its extended state, the valve body 200 will be pivotably moved through less than 90° of rotation to the closed dashed line position shown in FIG. 6, to bring the valve closing surface 216 into seated sealing engagement with the gas injector structure 178 which is adjacent thereto.

The gas injecting structure 178, as hereinbefore stated, is fully disclosed in U.S. Pat. No. 5,221,556, which is incorporated herein by reference. To insure a complete understanding of the present invention, the gas injector structure 178 will be briefly described.

The gas injector structure 178 as seen best in FIG. 6, includes an elongated injector housing 220 which is interposed between the substrate delivery port 146 of the handling sub-system housing 140 and the input to the processing sub-system 18. The injector housing 220 is provided with an elongated through port 222 which extends transversely therethrough so as to open onto both of the opposite planar surfaces 224 and 226 of the injector housing. The hereinbefore described isolation valve 176 is operable to selectively open and close the through port 222 of the injector housing 220 with the gas outlet side 227 of the port 222 remaining open to the processing sub-system 18 at all times. In otherwords, the valve closing surface 216 of the valve body 200 of the isolation valve 176, is movable into sealing engagement with the surface 224 of the injector housing 220 to close the end of the through port 222 which faces into the housing 140 of the substrate handling sub-system 16.

The injector housing 220 is further provided with a gas flow passage 228 that is normal with respect to the through port 222 and extends upwardly therefrom so as to open onto the top edge surface of the housing 220. An elongated flow control plate 230 having a plurality of variously sized apertures 232 (one shown) formed in spaced increments along its length, is mounted on the top edge of the injector housing 220 so that the apertures 232 open into the gas flow passage 228 of the housing 220. A gas inlet body 234 is mounted atop the flow control plate 230 and is configured to define a plenum chamber 36 having a bottom which opens onto the upper surface of the flow control plate. A gas inlet conduit 238 is mounted on the top end of the inlet body 234 for supplying gas under pressure from a remote source (not shown) to the plenum chamber 236. The plenum chamber distributes the gas pressure equally to all points in the chamber so that equal gas pressures will be applied to the open top end of each of the apertures 232. The gas will therefore flow into the gas flow passage 228 at various velocities as determined by the apertures of the flow control plate 230. The gas passes downwardly into the through port 222 with a predetermined velocity profile through the gas outlet side 227 thereof into the processing sub-system 18.

As hereinbefore mentioned, a single one of the processing sub-systems 18 may be coupled to the substrate handling sub-system 16 to form a complete chemical vapor deposition system 10, but the system 10 may be expanded to include a plurality of processing sub-systems 18 if desired. Each of the processing sub-systems 18 are preferably identical to each other, and the following description is intended to cover each such sub-system.

The processing sub-system 18, as seen best in FIGS. 6 and 7, includes a reaction chamber 240 which, as hereinbefore stated, is fully disclosed in U.S. Pat. No. 4,846,102 which is incorporated herein by reference. The reaction chamber 240 is an especially configured horizontal flow low-profile housing designed for producing desired gas flow characteristics from it's inlet end 242 to it's outlet end 244. The reaction chamber is formed of a material which is transparent to radiant heat energy, such as quartz, and is configured to work in conjunction with a special substrate supporting susceptor and temperature sensing sub-system 246.

The substrate supporting susceptor and temperature sensing sub-system 246 is fully disclosed in U.S. Pat. No. 4,821,674, which is expressly incorporated by reference. However, a brief description of the mechanism 246 will now be presented to provide a complete understanding of the system 10 of the present invention.

The substrate supporting and temperature sensing sub-system 246 includes a circular susceptor 248 which is configured to support a single substrate for rotation about an axis which is normal with respect to the center of the substrate. The circular susceptor 248 is mounted in the reaction chamber 240 on the upper end of a driveshaft assembly 250 which axially extends from the susceptor through a tubular shaft 252 that depends from the floor of the reaction chamber 240, as shown in FIG. 6. The driveshaft assembly 250 is coupled to a drive means 254 which rotates the driveshaft 250 and thus the susceptor 248. The tubular shaft 252 is sealingly coupled as at 256 to the drive means 254 and a purge gas inlet conduit 258 is provided for supplying purge gas from a remote source of gas under pressure (not shown). The purge gas is directed into the drive means 254 and is supplied through the tubular shaft 252 of the reaction chamber 240 and the driveshaft assembly 250 so as to enter the reaction chamber 240 below the rotatable susceptor 248. The susceptor 248, and therefore the substrates supportable thereon, are rotated for temperature averaging purposes and for averaging the thickness of the deposition layer resulting from the passage of reactant gas across the substrate.

A fixed, i.e. non-rotating ring 260 is supported in concentric relationship with respect to the rotatable susceptor 248 on a stand means 262 (FIG. 6) and a plurality of temperature sensors 266 (FIG. 8) are mounted at various points in the annular chamber 264 for sensing the temperatures at various points about the periphery of the rotatable susceptor. The temperature sensor 266 interact with a central temperature sensor 268 provided at the upper end of the driveshaft assembly 250 proximate the center of the rotatable susceptor, to produce control signals for operating a heating sub-system 270.

As hereinbefore stated, the heating sub-system 270 is fully disclosed in U.S. Pat. No. 4,836,138, which is expressly incorporated herein by reference. To insure a complete understanding of the system 10 of the present invention, a brief description of the heating sub-system 270 will now be presented.

The heating sub-system 270 includes an upper radiant heat assembly 272 which is disposed in overlaying relationship with respect to the reaction chamber 240, for directing radiant heat energy downwardly onto the rotating susceptor 248, the temperature sensing ring 260 and adjacent areas. A lower heat assembly 274 is disposed in underlying relationship with respect to the reaction chamber 240 for directing radiant heat energy upwardly into the reaction chamber onto the rotating susceptor 248 and the ring 260 and adjacent areas. The heating sub-system 270 also includes a heat concentrator structure 276 which is employed to direct concentrated radiant heat energy upwardly into the vicinity of the center of the rotatable susceptor 248, for temperature control purposes. The upper and lower heat assemblies 272 and 274 have individually controllable banks of discrete heating elements (not shown) for heating of the various regions on and about the rotatable susceptor 248 and the temperature ring 260, and those banks of elements in conjunction with the concentrator structure 276, which is also separately controlled, provided optimum temperature controlling capabilities.

The outlet end 244 of the reaction chamber 240 has a suitable flange 278 formed thereon and a spent gas collector means 280 is suitably coupled to that flange. The collector means includes a suitable housing 282 defining a collection chamber 284 into which spent reactant gas, purge gas and the like are received after passing through the reaction chamber 240. The spent gas is directed via a suitable hose 286 to a disposal location (not shown). A suitable motor 290, such as pneumatic, is mounted on the housing 282 and has a linearly extensible output shaft 292 (FIG. 1 and 8) for extending engagement with any fixed structural means (not shown). When operated to extend the shaft 292, the entire gas collector means 280 reacts by moving toward the reaction chamber 240 to load its inlet end 242 into sealed engagement with the gas injector structure 178, and to load the housing 282 into sealed engagement with the outlet end 244 of the reaction chamber.

While the principles of the invention have now been made clear in the illustrated embodiments, there will be immediately obvious to those skilled in the art, many modifications of structure, arrangements, proportions, the elements, materials and components used in the practice of the invention and otherwise, which are particularly adapted for specific environments and operation requirements without departing from those principles. The appended claims are therefore intended to cover and embrace any such modifications within the limits only of the true spirit and scope of the invention.

What we claim is:

1. A chemical vapor deposition system for processing substrates, said system comprising in combination:
  (a) a substrate handling subsystem including a housing defining a handling chamber and having a substrate input port, a substrate output port, a substrate delivery port, an isolation valve for selectively opening and closing said delivery port, and a pickup mechanism in said handling chamber for moving substrates one at a time from said input port to said delivery and output ports;
  (b) a substrate loading subsystem coupled to said input port for receiving a substrate to be processed from an external source and for transporting the substrate to a predetermined position near said input port;

(c) a processing subsystem coupled to said delivery port for receiving the substrate to be processed from said pickup mechanism at said delivery port, said processing subsystem including a housing forming a reaction chamber having an inlet end coupled to said delivery port and an outlet end and defining a substrate processing space within, said processing subsystem including a gas injector for injecting a reactant gas into said reaction chamber interposed between the delivery port of the housing of said substrate handling subsystem and the inlet end of said reaction chamber; and (d) a substrate unloading subsystem coupled to said outlet port for receiving a processed substrate from said pickup mechanism at said outlet port and transporting it to an off loading position.

2. A chemical vapor deposition system for processing substrates, said system comprising in combination:
 (a) a substrate handling subsystem including a housing defining a handling chamber and having a substrate input port, a substrate output port, a substrate delivery port, an isolation valve for selectively opening and closing said delivery port, and a pickup mechanism in said handling chamber for moving substrates one at a time from said input port to said delivery and output ports;
 (b) a substrate loading subsystem coupled to said input port for receiving a substrate to be processed from an external source and for transporting the substrate to a predetermined position near said input port;
 (c) a processing subsystem coupled to said delivery port for receiving the substrate to be processed from said pickup mechanism at said delivery port, said processing subsystem including a housing forming a reaction chamber coupled to said delivery port and defining a substrate processing space within; and
 (d) a substrate unloading subsystem coupled to said outlet port for receiving a processed substrate from said pickup mechanism at said outlet port and transporting it to an off loading position, said unloading subsystem comprising:
  i) a first housing defining a receiving chamber for supporting a cassette adapted to accommodate a stack of processed substrates, said receiving chamber including a hatch for providing ingress and egress for the cassette;
  ii) a second housing defining a feed chamber including a feed port in communication with said outlet port;
  iii) a cassette support platform; and
  iv) an apparatus for relocating said platform from a first position for receiving an empty cassette through said hatch to a second position proximate said feed port for depositing in the cassette processed substrates one at a time through said outlet port and said feed port from said pickup mechanism, said relocating apparatus including a device for returning said platform to its first position after deposit of processed substrates in the cassette, said relocating apparatus including a seal between said receiving chamber of said first housing and said feed chamber of said second housing to prevent contamination of said feed chamber in said first position.

3. The system of claim 2, wherein said substrate unloading system includes a purger for purging with a purge gas said receiving chamber subsequent to each closing of said hatch and prior to relocation of said platform from its first position.

4. A chemical vapor deposition system for processing substrates, said system comprising in combination:
 a. a substrate handling subsystem including a housing defining a handling chamber and having a substrate input port, a substrate output port, a substrate delivery port and a pickup mechanism in said handling chamber for moving substrates one at a time from said input port to said delivery and output ports;
 b. a substrate loading subsystem coupled to said input port for receiving a substrate to be processed from an external source and for transporting the substrate to a predetermined position near said input port;
 c. a processing subsystem coupled to said delivery port for receiving the substrate to be processed from said pickup mechanism at said delivery port, said processing subsystem including:
  i) a reaction chamber coupled to said delivery port, said reaction chamber including walls defining a horizontal gas flow path and including an inlet coupled with said delivery port and an outlet, said reaction chamber being formed of a material transparent to radiant heat energy; defining a substrate processing space within;
  ii) a susceptor disposed in said reaction chamber for receiving the substrate to be processed; and
  iii) a gas injector for injecting a reactant gas into said reaction chamber to deposit a material carried thereby on the substrate;
  iv) a locator for locating said gas injector between said delivery port and said reaction chamber;
  v) a driver for rotating said susceptor and a supported substrate about an axis which is normal with respect to a center of the substrate;
  vi) an upper radiant heating assembly disposed in overlaying relationship with said reaction chamber and having individually controllable banks of discrete heating elements for radiating downwardly heat energy on and about said susceptor;
  vii) a lower radiant heating assembly disposed in underlying relationship with said reaction chamber and having individually controllable banks of discrete heating elements for radiating upwardly heat energy on and about said susceptor;
  viii) a radiant heat concentrator disposed below said reaction chamber for radiating upwardly heat energy into the vicinity of a center of said susceptor;
  ix) a ring concentrically disposed about said susceptor;
  x) a temperature sensor for generating signals indicative of the temperatures at said susceptor and at said ring for individually controlling said banks of heating elements of said upper and lower radiant heating assemblies and said radiant heat concentrator;
  xi) a regulator for regulating the radiant energy output of said upper and lower radiant heating assemblies and of said radiant heat concentrator; and
 d. a substrate unloading subsystem coupled to said outlet port for receiving a processed substrate from said pickup mechanism at said outlet port and transporting it to an off loading position.

5. The system of claim 4, wherein said injector includes a device for injecting the gas into said reaction chamber with a predetermined velocity profile.

6. The system of claim 4, including an isolation valve proximate said delivery port for selectively opening and closing the delivery port to prevent a flow of contaminants into said reaction chamber.

7. The system of claim 4, and further comprising:
(a) a collector for collecting the gas flowing from said reaction chamber through said outlet and directing the gas to a disposal location; and
(b) a selector for selectively opening and closing said outlet of said reaction chamber.

8. A chemical vapor deposition system for processing substrates, said system comprising in combination:
a. a substrate handling subsystem including a housing defining a handling chamber and having a substrate input port, a substrate output port, a substrate delivery port and a pickup mechanism in said handling chamber for moving substrates one at a time from said input port to said delivery and output ports, said handling subsystem including an isolation valve for selectively opening and closing said delivery port, said isolation valve comprising:
 (i) a valve body for opening and closing said delivery port, said valve body having a first position to open said delivery port and a second position to close said delivery port and including an opposed pair of surfaces, and open port extending between the opposed pair of surfaces, said open port being coextensive and axially aligned with said delivery port when said valve body is in the first position;
 (ii) bearings for journaling said valve body to rotate said valve body about an axis transverse to a longitudinal axis of said open port;
 (iii) said valve body including a side for covering said delivery port when said valve body is in the second position;
 (iv) an actuator coupled to said valve body for rotating said valve body from said first position after passage of a substrate through said delivery port to the second position to seal the delivery port and prevent flow of contaminants through said delivery port and for returning said valve body to the first position;
b. a substrate loading subsystem coupled to said input port for receiving a substrate to be processed from an external source and for transporting the substrate to a predetermined position near said input port;
c. a processing subsystem coupled to said delivery port for receiving the substrate to be processed from said pickup mechanism at said delivery port, said processing subsystem including:
 i. a reaction chamber coupled to said delivery port and defining a substrate processing space within;
 ii. a susceptor disposed in said reaction chamber for receiving the substrate to be processed;
 iii. a gas injector for injecting a reactant gas into said reaction chamber to deposit a material carried thereby on the substrate; and
d. a substrate unloading subsystem coupled to said outlet port for receiving a processed substrate from said pickup mechanism at said outlet port and transporting it to an off loading position.

9. An isolation valve as set forth in claim 8, including a seal disposed on said side of said valve body for sealing said delivery port when said valve body is in the second position.

10. A chemical vapor deposition system for processing substrates, said system comprising in combination:
(a) a substrate handling subsystem including a housing defining a handling chamber and having a substrate input port, a substrate output port, a substrate delivery port, an isolation valve for selectively opening and closing said delivery port, and a pickup mechanism in said handling chamber for moving substrates one at a time from said input port to said delivery and output ports;
(b) a substrate loading subsystem coupled to said input port for receiving a substrate to be processed from an external source and for transporting the substrate to a predetermined position near said input port, said loading subsystem comprising:
 i) a first housing defining a receiving chamber for supporting a cassette adapted to accommodate a stack of substrates, said receiving chamber including a hatch for providing ingress and egress for the cassette;
 ii) a second housing defining a feed chamber including a feed port in communication with said input port for accommodating passage of a substrate from said feed chamber;
 iii) a plate separating said receiving chamber from said feed chamber, said plate including an opening formed therein;
 iv) a movable cassette support platform having an elevated position for receiving a cassette through said hatch, said support platform being in engagement with said plate in the elevated position, said support platform including a seal for sealing the opening between said first and second housings when in the elevated position;
 v) an elevator for moving said cassette support platform from the elevated position to a predetermined position relative to said feed port for off loading the substrates through said feed port and returning said cassette support platform to the elevated position upon completion of off loading the substrates; and
 vi) a purger for purging contaminants from said receiving chamber prior to movement of said support platform from the elevated position;
(c) a processing subsystem coupled to said delivery port for receiving the substrate to be processed from said pickup mechanism at said delivery port, said processing subsystem including a housing forming a reaction chamber coupled to said delivery port and defining a substrate processing space within; and
(d) a substrate unloading subsystem coupled to said outlet port for receiving a processed substrate from said pickup mechanism at said outlet port and transporting it to an off loading position.

* * * * *